(12) United States Patent
Gong et al.

(10) Patent No.: US 12,045,414 B2
(45) Date of Patent: *Jul. 23, 2024

(54) DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xuerui Gong, Beijing (CN); Jiangsheng Wang, Beijing (CN); Yong Yu, Beijing (CN); Chang Zhang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

This patent is subject to a terminal disclaimer.

(21) Appl. No.: 18/322,494

(22) Filed: May 23, 2023

(65) Prior Publication Data
US 2023/0297185 A1 Sep. 21, 2023

Related U.S. Application Data

(63) Continuation of application No. 16/767,577, filed as application No. PCT/CN2019/093280 on Jun. 27, 2019, now Pat. No. 11,698,695.

(51) Int. Cl.
*G06F 3/041* (2006.01)
*G06F 3/044* (2006.01)
(Continued)

(52) U.S. Cl.
CPC .......... *G06F 3/04164* (2019.05); *G06F 3/044* (2013.01); *H05K 1/0281* (2013.01);
(Continued)

(58) Field of Classification Search
None
See application file for complete search history.

(56) References Cited

U.S. PATENT DOCUMENTS 9,107,320 B2 * 8/2015 Kim ...................... H05K 1/147
9,788,429 B2 * 10/2017 Hong ..................... H05K 1/147
(Continued)

FOREIGN PATENT DOCUMENTS

CN 106504647 A 3/2017
CN 106898264 A 6/2017
(Continued)

OTHER PUBLICATIONS

ISA China National Intellectual Property Administration, International Search Report and Written Opinion Issued in Application No. PCT/CN2019/093280, Mar. 30, 2020, WIPO, 14 pages.
(Continued)

*Primary Examiner* — Fred Tzeng
(74) *Attorney, Agent, or Firm* — McCoy Russell LLP

(57) ABSTRACT

The embodiments of the present disclosure provide a chip on flex (COF), a touch assembly, and a display device. The chip on flex includes a flexible base provided with a first opening, the flexible base includes a bonding area provided with a plurality of metal bonding pads; on the flexible base, a spacing area with a preset range is provided between the first opening and the bonding area; wherein, the flexible base is provided with a reinforcement sheet thereon, the reinforcement sheet is located on a portion of the flexible base other than the first opening, the spacing area and the bonding area.

9 Claims, 4 Drawing Sheets

(51) Int. Cl.
*H05K 1/02* (2006.01)
*H05K 1/11* (2006.01)

(52) U.S. Cl.
CPC ............. *H05K 1/117* (2013.01); *H05K 1/118* (2013.01); *H05K 2201/10128* (2013.01)

(56) References Cited

U.S. PATENT DOCUMENTS

| | | | |
|---|---|---|---|
| 9,983,701 B2* | 5/2018 | Kim | G06F 3/04164 |
| 10,290,239 B2* | 5/2019 | Liu | G09F 9/301 |
| 11,337,308 B2* | 5/2022 | Cheng | H05K 1/189 |
| 11,372,504 B2* | 6/2022 | Wang | G06F 3/0412 |
| 2006/0215377 A1 | 9/2006 | Nomura et al. | |
| 2009/0044971 A1 | 2/2009 | Kataoka et al. | |
| 2009/0267229 A1 | 10/2009 | Shen | |
| 2010/0053049 A1 | 3/2010 | Sato et al. | |
| 2010/0165594 A1 | 7/2010 | Kim et al. | |
| 2012/0067624 A1 | 3/2012 | Kubo et al. | |
| 2016/0352031 A1* | 12/2016 | Ito | H05K 1/147 |
| 2017/0242457 A1 | 8/2017 | Lee et al. | |
| 2018/0146578 A1 | 5/2018 | Lee | |
| 2018/0164621 A1 | 6/2018 | Fukai | |
| 2018/0286293 A1 | 10/2018 | Liu | |
| 2019/0181388 A1 | 6/2019 | Kim et al. | |
| 2019/0332198 A1* | 10/2019 | Li | G06F 3/04164 |
| 2019/0363103 A1 | 11/2019 | Tang | |
| 2020/0045813 A1 | 2/2020 | Tajima et al. | |
| 2020/0119476 A1* | 4/2020 | Hu | H01R 13/6271 |
| 2020/0163208 A1* | 5/2020 | Suzuki | H05K 1/118 |
| 2020/0236213 A1 | 7/2020 | He | |
| 2020/0335429 A1 | 10/2020 | Okaue et al. | |
| 2021/0343466 A1 | 11/2021 | Honma et al. | |
| 2021/0396003 A1 | 12/2021 | Ohuchi et al. | |
| 2021/0402933 A1 | 12/2021 | Philippe et al. | |
| 2022/0064359 A1 | 3/2022 | Kelch | |
| 2023/0104812 A1* | 4/2023 | Wang | G06F 3/04164 345/173 |

FOREIGN PATENT DOCUMENTS

| | | |
|---|---|---|
| CN | 107102762 A | 8/2017 |
| CN | 207817356 U | 9/2018 |
| CN | 109906403 A | 6/2019 |

OTHER PUBLICATIONS

State Intellectual Property Office of the People's Republic of China, Office Action and Search Report Issued in Application No. 201980000923.8, Sep. 29, 2021, 12 pages. (Submitted with Partial Translation).
United States Patent and Trademark Office, Non-Final Office Action Issued in U.S. Appl. No. 16/767,577, filed Jan. 12, 2022, 14 pages.
United States Patent and Trademark Office, Final Office Action Issued in U.S. Appl. No. 16/767,577, filed Jul. 21, 2022, 10 pages.
United States Patent and Trademark Office, Advisory Action Issued in U.S. Appl. No. 16/767,577, filed Oct. 4, 2022, 2 pages.
United States Patent and Trademark Office, Non-Final Office Action Issued in U.S. Appl. No. 16/767,577, filed Nov. 18, 2022, 9 pages.
United States Patent and Trademark Office, Notice of Allowance Issued in U.S. Appl. No. 16/767,577, filed Mar. 8, 2023, 13 pages.
United States Patent and Trademark Office, Supplemental Notice of Allowance Issued in U.S. Appl. No. 16/767,577, filed Mar. 15, 2023, 2 pages.

* cited by examiner

DISPLAY DEVICE

CROSS-REFERENCE TO RELATED APPLICATIONS

This application is a continuation application of U.S. patent application Ser. No. 16/767,577 filed May 27, 2020, which is the U.S. national phase of PCT Application No. PCT/CN2019/093280 filed on Jun. 27, 2019, the disclosures of which are incorporated in their entirety by reference herein.

TECHNICAL FIELD

The present disclosure relates to the field of display technology, and in particular to a Chip On Flex (COF), a touch assembly, and a display device.

BACKGROUND

Recently, the touch screen has been rapidly developed as one of the important products for realizing human-computer interaction. From the early resistive touch screen to the current capacitive touch screen, the touch precision is greatly improved and the touch effect is improved. There are two types of capacitive touch screens: one is a self-capacitance type, and the other is a mutual capacitance type. Compared with the mutual capacitance touch screen, the self-capacitance touch screen has the advantages of low cost and satisfying the narrow-bezel design, and has a better development trend.

In the self-capacitance touch screen, since a large number of touch electrodes are directly connected to the bonding area by indium-tin-oxide (ITO) leads, and the number of bonding pads in the bonding area is equal to the number of ITO leads, the number of bonding pads is very large. As a result, the width of the bonding area is relatively large. Correspondingly, the connected Chip On Flex (COF) for the touch panel also requires a large width.

In the related art, when the display device is assembled, the COF connected to the touch panel needs to be bent to the side of the display assembly away from the touch panel, and bound to the main flexible circuit board of the display assembly. In order to prevent the interference between the COF for the touch panel with a large width and the driver chip, holes need to be formed in the COF for the touch panel. However, because the distance between the location for forming the holes and the bonding area of the COF is usually small, the COF is not easily bent. Moreover, there is a problem that the bent COF springs back and bulges under stress, which may result in an undesirable bending shape.

SUMMARY

The embodiments of the present disclosure provide a chip on flex (COF), a touch assembly, and a display device which solve the problem in the related art that the bent COF springs back and bulges under stress and thus obtaining an undesirable bending shape.

In order to achieve the above object, the present disclosure provides a chip on flex which includes a flexible base provided with a first opening, the flexible base includes a bonding area provided with a plurality of metal bonding pads; on the flexible base, a spacing area with a preset range is provided between the first opening and the bonding area; wherein, the flexible base is provided with a reinforcement sheet thereon, the reinforcement sheet is located on a portion of the flexible base other than the first opening, the spacing area and the bonding area.

Optionally, the reinforcement sheet is provided at least along one edge of the first opening.

Optionally, the reinforcement sheet is provided with a second opening, and an orthographic projection of the first opening on a plane where the reinforcement sheet is located is inside the second opening or coincides with edges of the first opening.

Optionally, the plurality of metal bonding pads in the bonding area are arranged along a first direction, the first opening is provided on a side away from the bonding area along a second direction which is vertical to the first direction;

between the first opening and the bonding area, a size range of the preset range in the first direction is equal to a size range of the flexible base in the first direction, and a size range of the preset range in the second direction is a preset width range from the bonding area.

Optionally, in the second direction, a distance between the first opening and the bonding area is larger than a width value of the preset width range.

Optionally, the metal bonding pads and the reinforcement sheet are located on a same surface of the flexible base.

Optionally, the chip on flex further includes a control chip which is located on a portion of the flexible base other than the first opening, the spacing area, the bonding area and the reinforcement sheet.

Optionally, the reinforcement sheet is adhered and fixed to the flexible base.

Optionally, the reinforcement sheet is made of a metal material.

The present disclosure further provides a touch assembly including a touch panel, wherein the touch assembly further includes the chip on flex according to any of the above.

Optionally, the touch assembly further includes a touch flexible circuit board which is electrically connected to a control chip on the chip on flex through a metal connection terminal on the chip on flex.

The present disclosure further provides a display device including a display assembly, wherein the display device further includes the touch assembly as mentioned above.

Optionally, the display device further includes a display flexible circuit board which is provided on a side of the display assembly away from the touch assembly;

a driver chip is provided on the display flexible circuit board, the chip on flex is bent at the spacing area, a portion on the flexible base away from the bonding area is stacked on the display flexible circuit board, and the driver chip is located in the first opening.

Optionally, the reinforcement sheet is provided on a surface of the flexible base opposite to the display flexible circuit board.

BRIEF DESCRIPTION OF THE DRAWINGS

In order to explain the embodiments of the present disclosure or the technical solutions in the related art more clearly, the drawings required in the description of the embodiments will be briefly introduced below. Obviously, the drawings in the following description are merely some of the embodiments of the present disclosure. For those of ordinary skill in the art, without making any creative efforts, other drawings can also be obtained based on these drawings.

DETAILED DESCRIPTION

The technical solutions in the embodiments of the present disclosure will be described clearly and completely in conjunction with the drawings in the embodiments of the present disclosure. Obviously, the described embodiments are only some of the embodiments of the present disclosure, but not all the embodiments. Based on the embodiments in the present disclosure, all other embodiments obtained by those of ordinary skill in the art without making creative efforts fall within the protection scope of the present disclosure.

The chip on flex (COF) provided in the present disclosure is applied to a display device to package a chip for controlling a panel onto the flexible base, thus realizing the interconnection between the panel and the driving system. The present disclosure relates to a COF in a display device which needs to be bent and needs to be provided with an avoidance hole for avoiding interference after bending, which can solve the problem of a undesirable bending shape resulting from that the bent COF springs back and bulges under stress.

In the self-capacitance touch screen, since there are a large number of bonding pads in the bonding area and the bonding area has a large width, the COF connected to the touch panel has a large width. The problem is common that the COF for the touch panel with a large width may interfere with the driver chip when it is bent during assembly. Accordingly, hereinafter the present disclosure will describe the implemented structure of the COF of the present disclosure in detail by mainly taking the COF of a touch panel as an example. It should be noted that the COF of the present disclosure is not limited to the COF of a touch panel.

Figure 1:
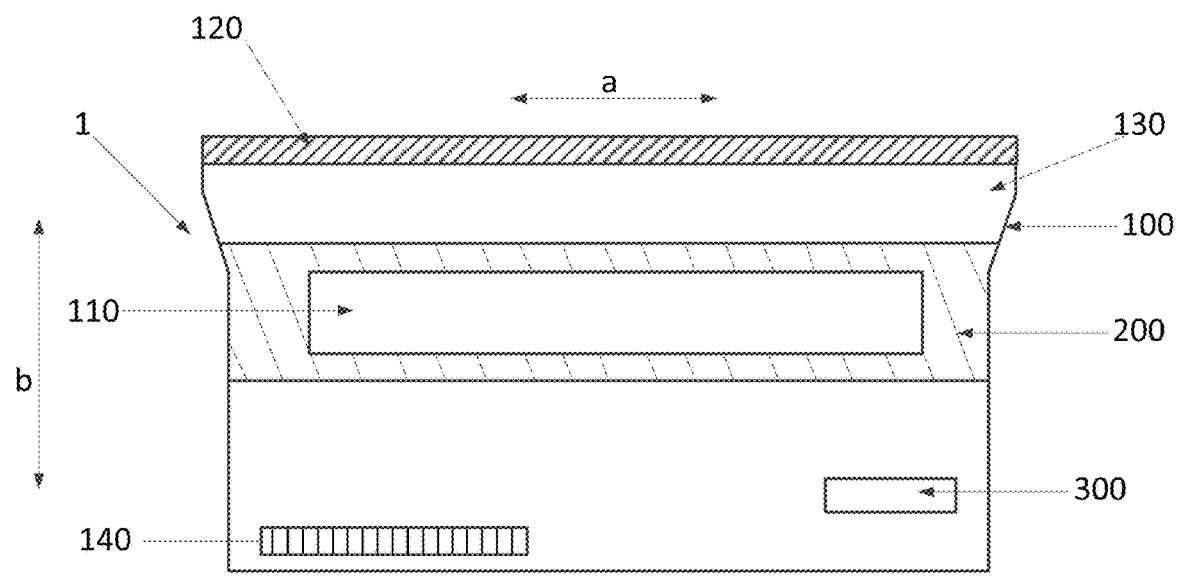
FIG. 1 is a structural diagram of a first embodiment of a chip on flex (COF) according to the present disclosure.

Referring to FIG. 1, in an embodiment, a COF 1 of the present disclosure includes a flexible base 100 provided with a first opening 110, the flexible base 100 includes a bonding area 120 provided with a plurality of metal bonding pads; on the flexible base 100, a spacing area 130 with a preset range being provided between the first opening 110 and the bonding area 120; wherein, the flexible base 100 is provided with a reinforcement sheet 200 thereon, the reinforcement sheet 200 is located on a portion of the flexible base 100 other than the first opening 110, the spacing area 130 and the bonding area 120.

It should be noted that, in a case that the COF 1 is assembled on a display device, the first opening 110 is an avoidance hole for avoiding interference occurring after the flexible base is bent. The specific shape and size of the first opening 110 may be adapted to the shape and size of a device which needs to be avoided.

In an embodiment, the bonding area provided with the metal bonding pads is used for connection between the COF 1 and the panel. In the case that the COF is a COF of a touch panel as described in the present disclosure, the bonding area 120 is used for connection with the touch panel.

Furthermore, the first opening 110 is an avoidance hole for the assembling of the COF 1, and a portion of the flexible base 100 provided with the first opening 110 needs to be bent to be in a different plane from the bonding area 120. Therefore, the area between the first opening 110 and the bonding area 120 constitutes a bending area portion of the flexible base 100. The size range of the bending area portion needs to satisfy a size condition that the portion of the flexible base 100 provided with the first opening 110 can be bent to a corresponding plane. Based on this, in the present disclosure, with reference to FIG. 1, the spacing area 130 between the first opening 110 and the bonding area 120 forms the bending area portion, and the preset range of the spacing area 130 is the size range satisfying a size condition that the portion of the flexible base 100 provided with the first opening 110 can be bent to a corresponding plane.

In the present disclosure, referring to FIG. 1, on the flexible base 100, a reinforcement sheet 200 is provided on a portion other than the first opening 110, the spacing area 130 and the bonding area 120. With the reinforcement sheet 200, the strength of the bent flexible base 100 is improved, and the problem that the bent COF warps to an undesirable bending shape is avoided.

It should be noted that, in the present disclosure, since the spacing area 130 of the preset range forms the bending area portion when the flexible base 100 is mounted on the display device, the arrangement of the reinforcement sheet 200 needs to avoid the spacing area 130, that is, the reinforcement sheet 200 should not be provided within the spacing area 130.

Figure 5:
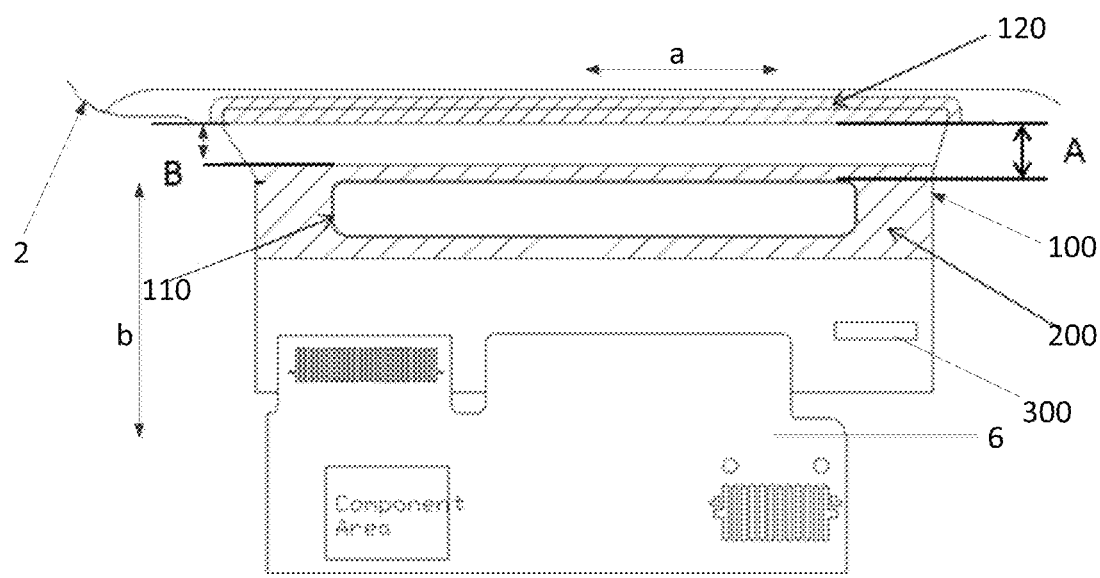
FIG. 5 is a partial structural diagram of a touch assembly employing the chip on flex (COF) according to the present disclosure.

Specifically, in an embodiment of the present disclosure, with reference to FIGS. 1 and 5, the plurality of metal bonding pads (not shown in figures) in the bonding area 120 are arranged along a first direction a, the first opening 110 is provided on a side away from the bonding area 120 along a second direction b which is vertical to the first direction a.

According to the above arrangement position of the first opening 110 relative to the bonding area 120, when bending the flexible base 100, it is necessary to bend an edge of the flexible base 100 which is along the second direction b between the first opening 110 and the bonding area 120.

Between the first opening 110 and the bonding area 120, a preset range in which the reinforcement sheet 200 cannot be set, i.e., the spacing area 130, is determined in the following manner:

between the first opening 110 and the bonding area 120, a size range of the preset range in the first direction a is equal to a size range of the flexible base 100 in the first direction a, and a size range of the preset range in the second direction b is a preset width range B from the bonding area 120.

The size of the preset width range B may be determined according to the size of the width of the bending area portion when the flexible base 100 is mounted on the display device.

In an embodiment, the size of the preset width range B is equal to the width of the bending area portion when the flexible base 100 is mounted on the display device.

In another embodiment, the size of the preset width range B is larger than the width of the bending area portion when the flexible base 100 is mounted on the display device, and optionally, is equal to a width value obtained by adding an adjustment value to the width of the bending area portion.

Based on the determination manner of the spacing area 130 between the first opening 110 and the bonding area 120, referring to FIG. 1, in an embodiment, along the second direction b, a distance A between the first opening 110 and the bonding area 120 is larger than the width value of the preset width range B.

In this embodiment, since the distance A between the first opening 110 and the bonding area 120 is larger than the width value of the preset width range B along the second direction b, at least a part of the reinforcement sheet 200 may be provided between the first opening 110 and the bonding area 120, as long as it does not cover the spacing area 130.

In another embodiment, along the second direction b, the distance A between the first opening 110 and the bonding area 120 is equal to the width value of the preset width range B.

In this embodiment, the reinforcement sheet 200 cannot be provided between the first opening 110 and the bonding area 120.

In an embodiment of the present disclosure, referring to FIG. 1, the reinforcement sheet 200 is formed in a sheet structure with a second opening 210. On the flexible base 100, the second opening 210 of the reinforcement sheet 200 is opposite to the first opening 110 of the flexible base 100, and an orthographic projection of the first opening 110 on a plane where the reinforcement sheet 200 is located is inside the second opening 210 or coincides with edges of the first opening 110.

In the above embodiment, the reinforcement is formed in a structure provided surround the first opening 110. In order to ensure that the first opening 110 on the COF 1 has the avoidance function when the COF 1 is mounted on the display device, the reinforcement sheet 100 cannot cover the first opening 110. Thus, the reinforcement sheet 200 avoids the first opening 110 through the second opening 210, so that the orthographic projection of the first opening 110 on the plane where the reinforcement sheet 200 is located is inside the second opening 210 or coincides with the edges of the first opening 110.

Figure 2:
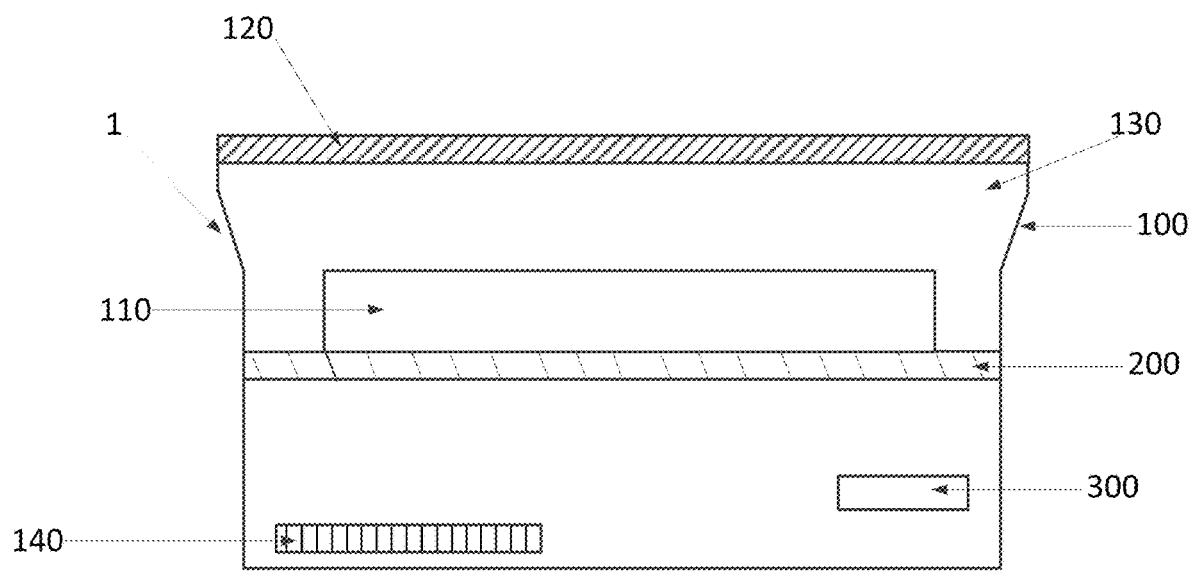
FIG. 2 is a structural diagram of a second embodiment of a chip on flex (COF) according to the present disclosure.

In an embodiment of the present disclosure, referring to FIG. 2, the reinforcement sheet 200 is provided along one of the edges of the first opening 110. Optionally, in this embodiment, the edge of the first opening 110 along which the reinforcement sheet 200 is provided may be an edge of the first opening 110 away from the side of the bonding area 120; obviously, optionally, the edge of the first opening 110 along which the reinforcement sheet 200 is provided may be an edge of the first opening 110 close to the side of the bonding area 120.

Figure 3:
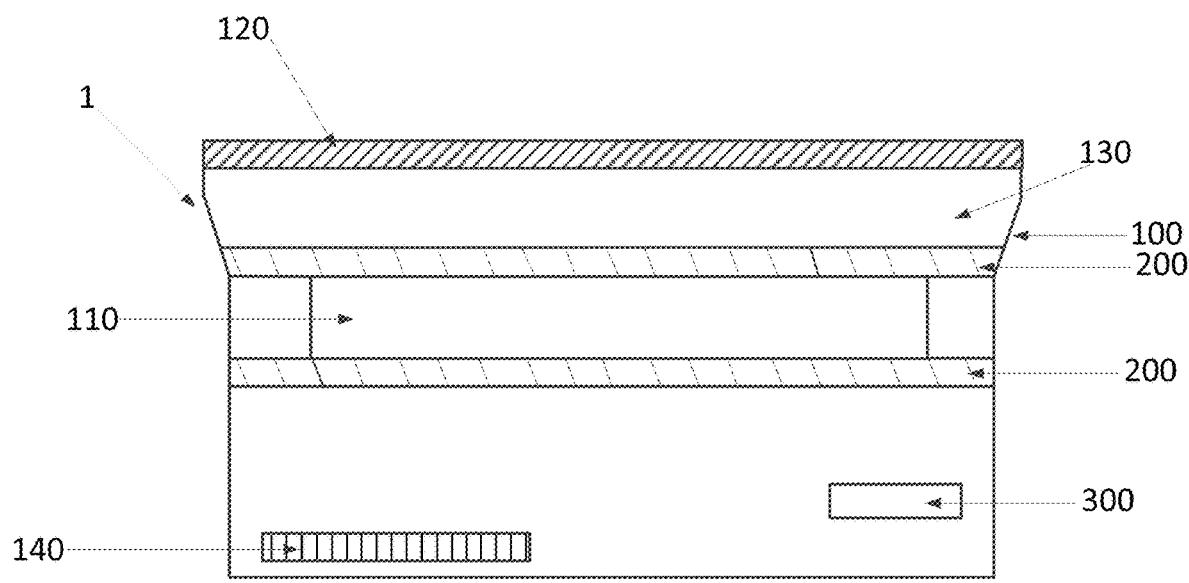
FIG. 3 is a structural diagram of a third embodiment of a chip on flex (COF) according to the present disclosure.

In another embodiment, referring to FIG. 3, the reinforcement sheet 200 is provided along two of the edges of the first opening 110. Optionally, the edges of the first opening 110 along which the reinforcement sheet 200 is provided may be two opposite edges, one of the two opposite edges is the edge of the first opening 110 away from the side of the bonding area 120, and the other of the two opposite edges is the edge of the first opening 110 close to the side of the bonding area 120.

In the COF in the present disclosure, by providing the reinforcement 200 at the edge(s) of the first opening 110 on the flexible base 100, the problem can be effectively avoid the interference of the bent flexible base 100 occurring when the flexible base 100 is bent, due to the warpage or bulge of the portion in which the first opening 110 is provided.

It should be noted that, in the above arrangement structure of the reinforcement sheet 200, when the reinforcement sheet 200 is provided between the first opening 110 and the bonding area 120, along the second direction b, the distance A between the first opening 110 and the bonding area 120 is larger than the width value of the preset range B, and the restriction on the width of the reinforcement sheet 200 set between the first opening 110 and the bonding area 120 is that it does not cover the spacing area 130.

In embodiment of the present disclosure, the reinforcement sheet 200 is made of a metal material having a certain strength and hardness, such as a steel sheet, to ensure that, after the reinforcement sheet 200 is mounted on the flexible base 100, the reinforcement sheet 200 can improve the strength of the flexible base 100 upon bending, thus avoiding the problem that the bent COF warps to an undesirable bending shape.

Figure 4:
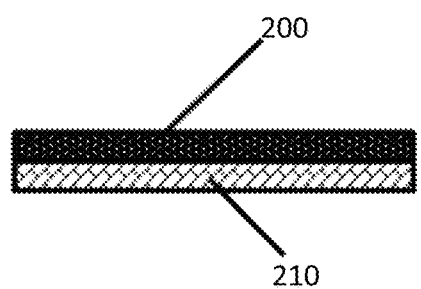
FIG. 4 is a structural diagram illustrating a connection manner between a reinforcement sheet and a flexible base of the chip on flex (COF)

Optionally, the reinforcement sheet 200 is adhered and fixed on the flexible base 100. As shown in FIG. 4, an adhesive layer 210 may be provided on the reinforcement sheet 200, and through the adhesive layer 210, the reinforcement sheet 200 can be adhered and fixed on the flexible base 100.

It should be noted that, The reinforcement sheet 200 is not limited to being able to be fixed on the flexible base 100 only by adhering, but other fixing methods may also be used.

In an embodiment of the present disclosure, on the flexible base 100, the reinforcement sheet 200 and the metal bonding pads in the bonding area 120 are located in a same surface.

In the present disclosure, as shown in FIGS. 1 to 6, the COF further includes a control chip 300 which is located on a portion of the flexible base 100 other than the first opening 100, the spacing area 130, the bonding area 120 and the reinforcement 200.

Specifically, the control chip 300 is electrically connected to the metal bonding pads in the bonding area 120.

With reference to FIGS. 1 to 6, in an embodiment, the COF may further includes a metal connection terminal for connecting the flexible circuit board. The control chip 300 is electrically connected to the metal connection terminal 140 so that the electrical connection between the control chip 300 and the flexible circuit board is achieved.

Optionally, in a case that the COF 1 is a COF of a touch panel, the flexible circuit board connected with the COF 1 is a touch flexible circuit board 6.

Figure 6:
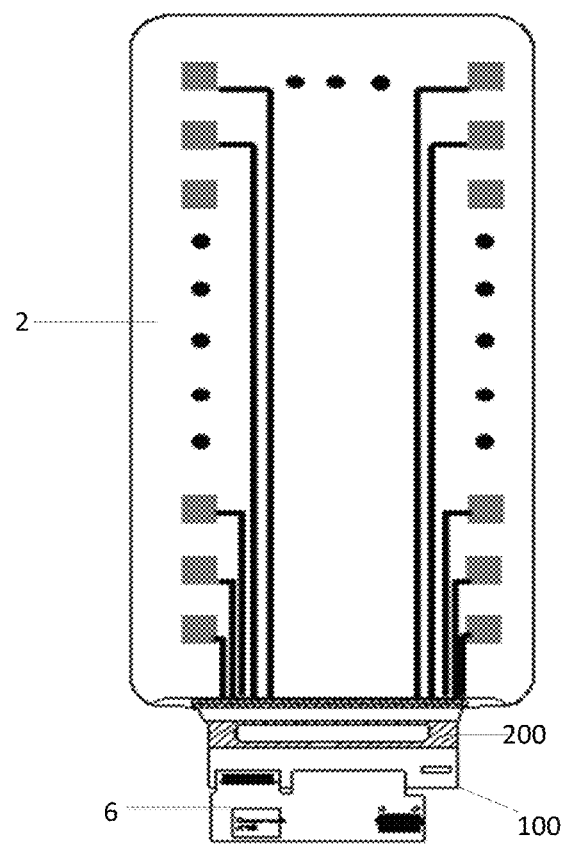
FIG. 6 is a structural diagram of a touch assembly employing the chip on flex (COF) according to the present disclosure.

Referring to FIGS. 5 and 6, in the case that the COF 1 is the COF of a touch panel, the COF 1 is connected to the touch panel 2 through the metal bonding pads in the bonding area 120, and is connected to the touch flexible circuit board 6 through the metal connection terminal 140.

Taking that the COF 1 is the COF of a touch panel as an example, a specific implementation structure of the COF in the present disclosure is further described in detail.

Figure 7:
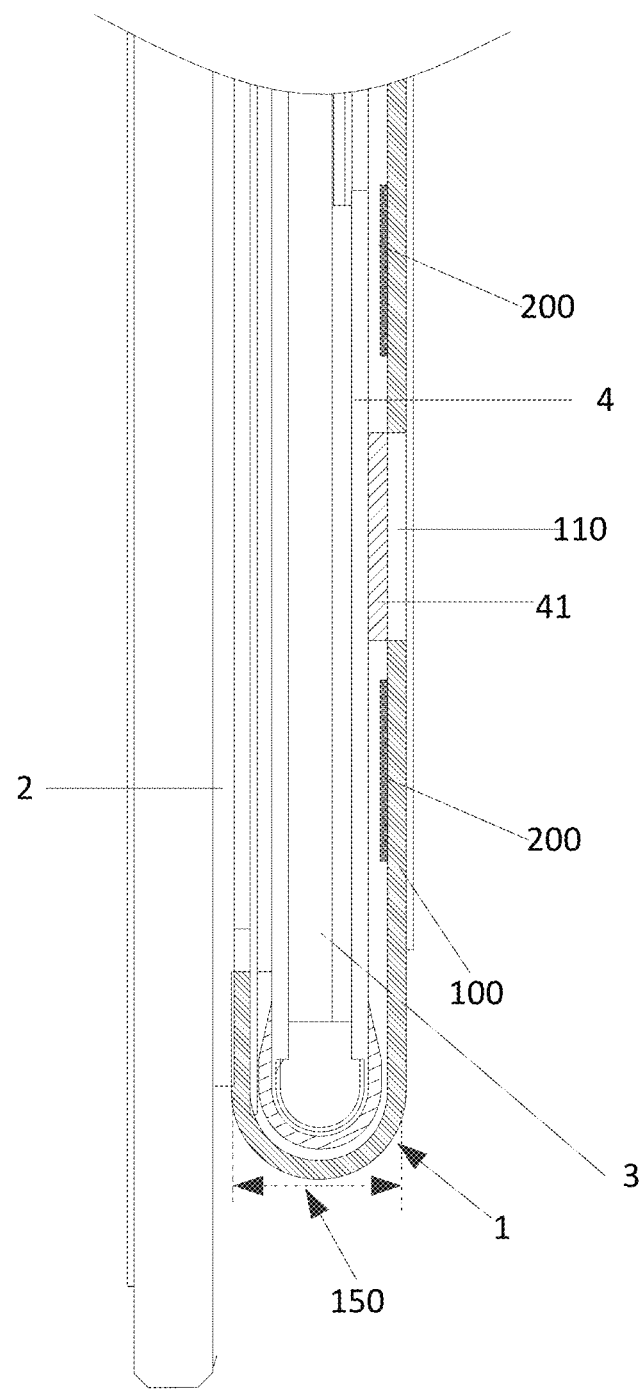
FIG. 7 is a partial structural diagram of a display device employing the chip on flex (COF) according to the present disclosure.

Referring to FIGS. 6 and 7, and in conjunction with FIG. 5, the display device to which the COF 1 is applied further includes a touch panel 2 and a display assembly 3 that are stacked, wherein a display flexible circuit board 4 for controlling display of the display assembly 3 is provided on a side of the display assembly 3 away from the control panel 2. The bonding area 120 of the COF 1 is connected to the touch panel 2, a portion of the COF 1 extending from the bonding area 120 needs to be bent towards the side where the display assembly 3 is provided, and is stacked on the display flexible circuit board 4.

In an embodiment of the present disclosure, the first opening 110 provided on the COF 1 is used to avoid interference with a driver chip 41 on the display flexible circuit board 4.

In addition, referring to FIGS. 5 to 7, when the COF 1 is being bent, a bending area portion 150 is formed between the first opening 110 and the bonding area 120. On the display device, the thickness between the touch panel 2 and the display flexible circuit board 4 determines the size of the bending area portion 150.

Therefore, on the portion of the flexible base 100 extending from the bonding area 120 towards the second direction b, the size range of the spacing area 130 on the flexible base 100 needs to be larger than or equal to the size range of the bending area portion 150, and the reinforcement sheet 200 cannot be provided within the range of the spacing area 130.

In an embodiment of the present disclosure, the reinforcement sheet 200 is provided surround the edges of the first opening 110, and provided on a surface of the flexible base 100 opposite to the display flexible circuit board 4.

According to FIG. 7, when the COF 1 is bent towards the side where the display assembly 3 is provided, the portion of the flexible base 100 on which the first opening 110 is stacked on the display flexible circuit board 4, and the first opening 110 is opposite to the driver chip 41 on the display flexible circuit board 4. Optionally, the driver chip 41 is located in the first opening 110. Thus, the first opening 110 can achieve the effect of avoiding the driver chip 41, avoiding the interference occurring when the flexible base 100 is bent. In an embodiment of the present disclosure, the size of the first opening 110 is larger than the size of the driver chip 41 so that the arrangement of the first opening 110 can effectively dissipate heat for the driver chip 41.

An embodiment of the present disclosure further provides a touch assembly. As shown in FIGS. 5 and 6, the touch assembly includes the touch panel 2 and the COF 1 with the above implementation structure.

In an embodiment, the touch panel 2 is a self-capacitance touch panel. A plurality of metal bonding pads are arranged on the bonding area of the COF 1 through which the touch panel 2 is connected, and the width of the bonding area is not less than 48 mm. In an embodiment, as shown in FIG. 6, the touch assembly further includes a touch flexible circuit board 6 which is electrically connected to the control chip 300 on the COF 1 through the metal connection terminal 140 provided in the COF 1.

The present disclosure further provides a display device including a display assembly. The display device further includes the touch assembly with the above implementation structure.

In the present disclosure, the COF for the touch panel employed in the touch assembly may refer to the above detailed description in conjunction with FIGS. 1 to 6, and will not be described in detail here.

In an embodiment, as shown in FIG. 7, the display device further includes a display flexible circuit board 4 which is provided on a side of the display assembly away from the touch assembly;

wherein a driver chip 41 is provided on the display flexible circuit board 4, the COF 1 is bent at the spacing area 130, a portion on the flexible base 100 away from the bonding area 120 is stacked on the display flexible circuit board 4, and the driver chip 41 is located in the first opening 110.

In an embodiment, as shown in FIG. 7, the reinforcement sheet 200 is provided on a surface of the flexible base 100 opposite to the display flexible circuit board 4.

In an embodiment, the display device is an Active-matrix organic light-emitting diode (AMOLED) display device.

By adding a reinforcement sheet on the chip on flex, the chip on flex, the touch assembly and the display device provided by the present disclosure can use the strength and hardness of the reinforcement sheet to ensure that no warpage occurs in the chip on flex when the chip on flex is bent after the display device is assembled, so as to improve the yield of the display device during assembly, ensure the sensitivity of the touch performance of the touch assembly, and obtain a more durable use experience.

The above is only the preferred embodiment of the present disclosure. It should be noted that, for those of ordinary skill in the art, without departing from the principles of the present disclosure, various improvements and modifications can be made. These improvements and modifications should also be considered as the protective scope of the present disclosure.

What is claimed is:

1. A display device, comprising a display assembly and a touch assembly, wherein the touch assembly comprises a touch panel, a chip on flex, and a touch flexible circuit board, the chip on flex comprising a flexible base provided with a first opening, the flexible base comprising a bonding area provided with a plurality of metal bonding pads; on the flexible base, a spacing area with a preset range being provided between the first opening and the bonding area; wherein, the flexible base is provided with a reinforcement sheet thereon, the reinforcement sheet is located on a portion of the flexible base other than the first opening, the spacing area and the bonding area, wherein the reinforcement sheet is made of steel, wherein the display device further comprises a display flexible circuit board which is provided on a side of the display assembly away from the touch assembly;

a driver chip is provided on the display flexible circuit board, the chip on flex is bent at the spacing area, a portion on the flexible base away from the bonding area is stacked on the display flexible circuit board, and the driver chip is located in the first opening;

wherein along a first direction, the width of the chip on flex at the bonding area is larger than the width of the chip on flex at a location corresponding to the first opening.

2. The display device according to claim 1, wherein the reinforcement sheet is provided on a surface of the flexible base opposite to the display flexible circuit board.

3. The display device according to claim 1, wherein the reinforcement sheet is provided at least along one edge of the first opening.

4. The display device according to claim 1, wherein the reinforcement sheet is provided with a second opening, and an orthographic projection of the first opening on a plane where the reinforcement sheet is located is inside the second opening or coincides with edges of the first opening.

5. The display device according to claim 1, wherein the plurality of metal bonding pads in the bonding area are arranged along the first direction, the first opening is provided on a side away from the bonding area along a second direction, the second direction is vertical to the first direction;

between the first opening and the bonding area, a size range of the preset range in the first direction is equal to a size range of the flexible base in the first direction, and a size range of the preset range in the second direction is a preset width range from the bonding area.

6. The display device according to claim 5, wherein, in the second direction, a distance between the first opening and the bonding area is larger than a width value of the preset width range.

7. The display device according to claim 1, wherein the metal bonding pads and the reinforcement sheet are located on a same surface of the flexible base.

8. The display device according to claim 1, wherein the chip on flex further comprises a control chip which is located on a portion of the flexible base other than the first opening, the spacing area, the bonding area and the reinforcement sheet.

9. The display device according to claim 1, wherein the reinforcement sheet is adhered and fixed to the flexible base.

\* \* \* \* \*